(12) United States Patent
Jin et al.

(10) Patent No.: US 6,900,481 B2
(45) Date of Patent: May 31, 2005

(54) NON-SILICON SEMICONDUCTOR AND HIGH-K GATE DIELECTRIC METAL OXIDE SEMICONDUCTOR FIELD EFFECT TRANSISTORS

(75) Inventors: Been-Yih Jin, Lake Oswego, OR (US); Reza Arghavani, Aloha, OR (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/081,992

(22) Filed: Feb. 21, 2002

(65) Prior Publication Data

US 2002/0168826 A1 Nov. 14, 2002

(51) Int. Cl.[7] .................. H01L 27/148; H01L 29/80; H01L 31/062; H01L 21/28
(52) U.S. Cl. .................. 257/249; 257/284; 257/289; 257/411; 257/E21.193; 257/E21.266; 257/E21.274; 438/303
(58) Field of Search .................. 257/249, 284, 257/289, 411, E21.193, E21.266, E21.274; 438/592, 682, 683, 586

(56) References Cited

U.S. PATENT DOCUMENTS

| 4,837,605 | A | * | 6/1989 | Kasahara et al. | |
|---|---|---|---|---|---|
| 5,185,286 | A | * | 2/1993 | Eguchi | |
| 5,294,818 | A | * | 3/1994 | Fujita et al. | |
| 5,545,574 | A | * | 8/1996 | Chen et al. | |
| 6,087,208 | A | * | 7/2000 | Krivokapic et al. | 438/183 |
| 6,100,120 | A | * | 8/2000 | Yu | 438/151 |
| 6,376,349 | B1 | * | 4/2002 | Tobin et al. | |

OTHER PUBLICATIONS

Chau et al., International Electron Devices Meeting 2000, San Francisco, CA, Dec. 10–13, 2000.
Ghani et al., Symposium on VLSI Technology Digest of Technical Papers, Honolulu, HI, Jun. 13–15, 2000.
Hubbard et al., "Thermodynamic stability of binary oxides in contact with silicon" J. Mater. Res., vol. 11, No. 11, Nov. 1996.

* cited by examiner

*Primary Examiner*—Michael S. Lebentritt
*Assistant Examiner*—Ron Pompey
(74) *Attorney, Agent, or Firm*—Fish & Richardson P.C.

(57) ABSTRACT

A method for forming a transistor includes forming a gate dielectric layer over a portion of a semiconductor substrate, the substrate being substantially free of silicon; defining a gate electrode over a portion of the gate dielectric layer; and introducing ions into the substrate proximate the gate electrode to define source and drain regions. A transistor includes a semiconductor substrate that is substantially free of silicon and a gate dielectric layer over a portion of the substrate. The transistor can also include a gate electrode over a portion of the gate dielectric layer and introduce ions proximate the gate electrode, defining source and drain regions.

12 Claims, 5 Drawing Sheets

NON-SILICON SEMICONDUCTOR AND HIGH-K GATE DIELECTRIC METAL OXIDE SEMICONDUCTOR FIELD EFFECT TRANSISTORS

TECHNICAL FIELD

This application relates to metal oxide semiconductor field effect transistors (MOSFETs) formed with non-silicon semiconductors and high dielectric constant (k) gate dielectrics.

BACKGROUND

Silicon is commonly used as a substrate material for the fabrication of integrated circuits. Devices are continually being scaled down in size, including in the vertical direction by reducing gate oxide thickness and in the horizontal direction by reducing channel length. Device power supply voltage ($V_{dd}$) is also being reduced to reduce power consumption.

Silicon material properties, as well as integrated circuit processing capabilities, restrict the shrinking of silicon-based devices. These limiting properties include the intrinsic carrier mobility of silicon [$\mu_n$=-1450 centimeter$^2$ * volts$^{-1}$ * second$^{-1}$ ($cm^2V^{-1}s^{-1}$) and $\mu_p$=450 $cm^2V^{-1}s^{-1}$, where $\mu_n$=mobility of n-type carriers and $\mu_p$=mobility of p-type carriers] which sets the achievable cutoff frequency to less than 160 Gigahertz (GHz) for a gate length of 30 nanometers (nm).

Power dissipation increases as threshold voltage ($V_t$) decreases. Two major components of power dissipation are dynamic capacitive switching and static off-state leakage current. Dynamic power dissipation can be expressed as $P_d=CV^2f$, where C=capacitance, V=operating voltage, and f=repetition frequency. Lowering V decreases dynamic power dissipation, but the effect is offset by higher operating frequency and increased C due to the vertical scaling down of gate dielectric thickness.

Leakage current primarily comprises subthreshold conduction in off-state ($I_{sub}$), reverse bias pn junction conduction ($I_D$), and tunneling through gate dielectrics($I_g$) Subthreshold conduction occurs when a MOSFET device is operated with a $V_g$ below $V_t$. Subthreshold conduction is proportional to the weak inversion carrier density $\sim e^{-\phi_s/kT}$, where $\phi_s$=electric potential at semiconductor surface, k=Boltzmann's constant, and T=temperature, with $\phi_s$ being proportional to the difference between $V_g$ and $V_t$. During the process of lowering the operating voltage, $V_t$ should also be lowered to maintain the $V/V_t$ ratio for sufficient current gain. An adverse consequence is that subthreshold leakage current increases exponentially with decreasing $V_t$.

Reverse bias leakage current occurs at reverse biased drain/well and source/well junction regions. It is caused by thermal generation in depleted regions and by diffusion of minority carriers across reverse biased junctions. This leakage is especially problematic at the source and channel well regions when the channel length is so short that the electric field of the drain to source voltage effectively lowers the barrier across the source/channel depletion region and causes large offstate leakage current. This is commonly called drain induced barrier lowering effect for short channel devices.

Tunneling leakage is due to quantum mechanical tunneling of electron wavefunction across a gate dielectric. Tunneling leakage is expected to increase as conventional silicon dioxide ($SiO_2$) gate dielectrics shrink in a vertical dimension. This tunneling leakage current will become a dominant source of off-state leakage when conventional silicon dioxide layers are scaled down below an effective oxide thickness ($T_{ox}$) of 1.6 nm.

These static power dissipation effects become a significant portion of the total power dissipation in increasingly smaller and highly packed logic products.

DESCRIPTION

A high speed device, having a high cutoff frequency, e.g., >200 GHz with a 30 nm gate length, can be fabricated by using a semiconductor substrate with a narrow band gap and a carrier mobility higher than that of silicon. A high carrier mobility allows one to achieve a higher device speed than a silicon-based device with the same transistor gate length. Using a substrate with a high carrier mobility, therefore, allows one to achieve higher device speeds without requiring greater photolithographic capabilities.

A high carrier mobility can also allow lower operating voltage (V) for a given threshold voltage ($V_T$). Because drain current is proportional to the product of carrier mobility and V–$V_t$, a high mobility semiconductor can provide equivalent current gain with a smaller difference V–$V_t$ or, in another words, a smaller $V/V_t$ ratio. A lower operating voltage, in turn, lowers power consumption. In an alternative embodiment, by using a non-silicon substrate with a high carrier mobility, one can maintain the threshold voltage of a transistor at a sufficiently high value to avoid excessive leakage current, while still achieving lower power consumption with a lower operating voltage without losing current gain.

A high mobility non-silicon semiconductor substrate is used to gain higher transistor operation speed. In some embodiments, the high mobility non-silicon semiconductor substrate can allow lower operating voltage without significantly lowering the threshold voltage. This avoids large subthreshold leakage in short channel devices.

To fabricate a non-silicon based transistor, a gate dielectric chemically compatible with the substrate is identified, which is analogous to the $SiO_2$ used with silicon. An atomically smooth interface between the substrate and the gate dielectric is used to reduce surface recombination due to interface traps and electron hole pair generation at the substrate/gate dielectric interface. In comparison, in the $Si/SiO_2$ system, less than one charge site in $10^5$ interface atoms is achievable at the $Si/SiO_2$ interface. The dielectric has a high dielectric constant that allows thicker gate dielectric thickness, thereby reducing gate leakage current.

Figure 1:
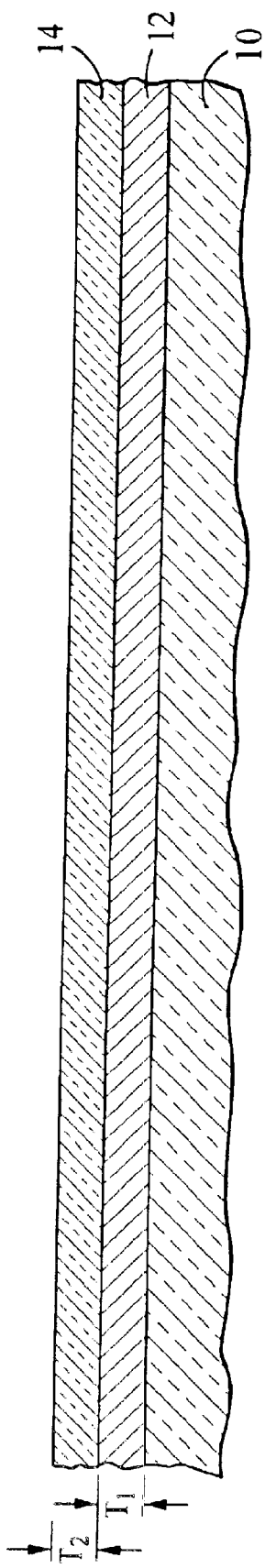
FIGS. 1–6 are cross-sectional views of a device made on a non-silicon semiconductor substrate, at various points of fabrication.

Referring to FIG. 1, a semiconducting substrate 10, referred to hereinafter as "substrate," is made of a bulk semiconducting material other than silicon. The semiconducting material can be, for example, germanium, indium antimonide, lead telluride, indium arsenide, indium phosphide, gallium arsenide, gallium antimonide, etc. The semiconducting material is selected so that substrate 10 has a relatively high carrier mobility, preferably higher than that of silicon, that has an n-type carrier mobility of $\mu_n$~1450 $cm^2V^{-1}s^{-1}$ and a p-type carrier mobility of $\mu_p$~450 $cm^2V^{-1}s^{-1}$. The selected semiconducting material has a narrow bandgap. In some embodiments, the bandgap is narrower than that of silicon. Silicon has a bandgap of 1.11 electron-volts (eV). For example, if substrate 10 is made of germanium, substrate 10 has an n-type carrier mobility of $\mu_n \sim 3900$ cm$^2$V$^{-1}$s$^{-1}$, a p-type carrier mobility of $\mu_p \sim 1900$ cm$^2$V$^{-1}$s$^{-1}$, and a bandgap of 0.66 eV. A higher carrier mobility allow a transistor built on substrate 10 to have a higher cutoff frequency, e.g., >200 GHz, than that which can be achieved with silicon, e.g., <160 GHz for a transistor having a same gate length, e.g., 30 nm.

A sacrificial oxide layer 12, such as a metal oxide, is formed on substrate 10 by, e.g., plasma enhanced chemical vapor deposition (PECVD). Sacrificial oxide layer 12 serves as a protective layer for substrate 10 during subsequent processing steps such as implant, clean, and polishing. Sacrificial oxide layer 12 protects substrate 10 from contamination, provides a low defect interface, and can be etched away easily with a high selectivity to the underlying substrate 10. Sacrificial oxide layer 12 may have a thickness $T_1$ of 10–2000 Åangstroms (Å). In an embodiment, sacrificial oxide layer 12 has a thickness $T_1$ of 10–500 Å. A polishing stop layer 14 is deposited by PECVD over sacrificial oxide layer 12. Polishing stop layer 14 has a thickness $T_2$ of, e.g., 1000–2000 Å, and is made of a hard material, such as silicon nitride, which can act as polishing stop layer during subsequent processing.

Figure 2:
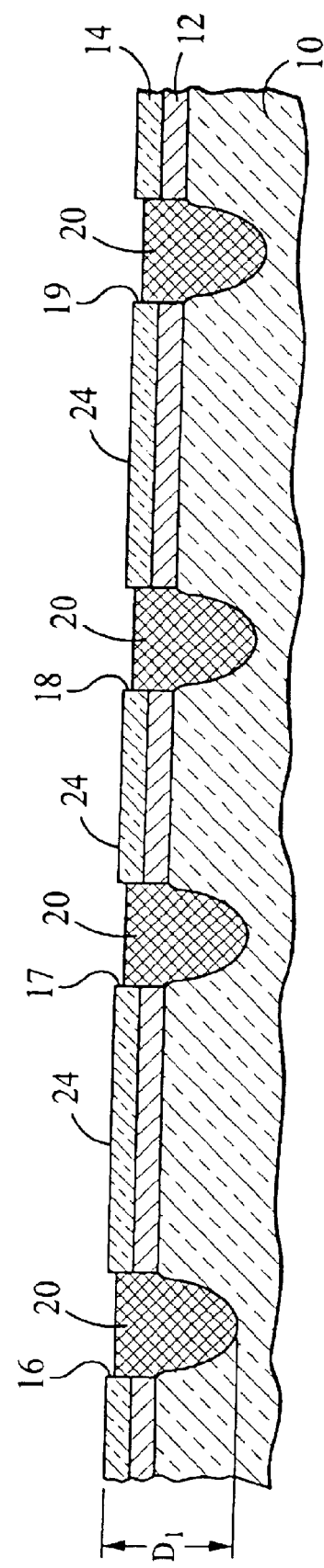

Referring to FIG. 2, first isolation trench 16, second isolation trench 17, third isolation trench 18, and fourth isolation trench 19 are etched through polishing stop layer 14 and sacrificial oxide layer 12 and into substrate 10. First, second, third, and fourth isolation trenches 16, 17, 18, 19 have a depth $D_1$ of, e.g., 100 Å–10 microns ($\mu$m), sufficient to form isolating barriers between devices subsequently formed between isolation trenches 16, 17, 18, 19 in substrate 10. First, second, third, and fourth isolation trenches 16, 17, 18, 19 are subsequently filled with an insulating material 20, such as a metal oxide and/or silicon dioxide. Insulating material 20 may be deposited by PECVD. Excess insulating material 20 (not shown) may be removed by chemical mechanical polishing (CMP) to expose a top surface 24 of polishing stop layer 14.

Figure 3:
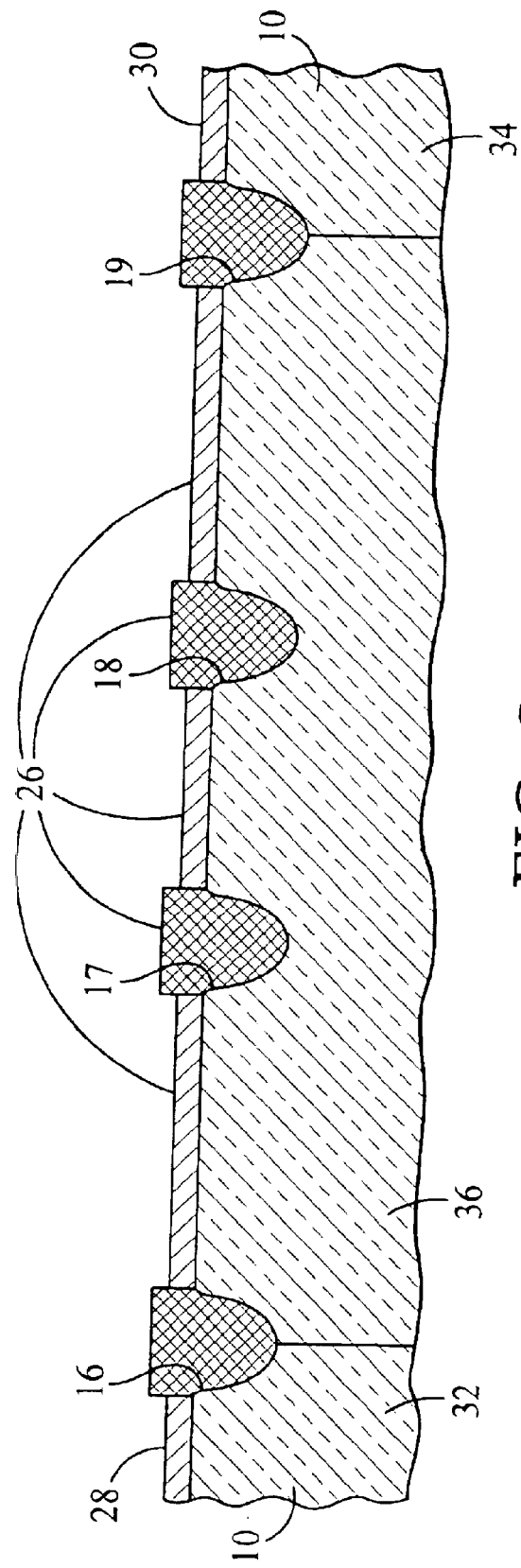

Referring also to FIG. 3, polishing stop layer 14 is removed by a wet etch. A first photoresist layer (not shown) is applied and patterned to protect center region 26 between first and fourth isolation trenches 16, 19. Ions are implanted in regions 28, 30, which are unprotected by the first photoresist layer, to form first and second n-wells 32, 34 by doping substrate 10. In the case of a substrate 10 comprising a group IV element, such as germanium, the ions implanted to form n-wells 32, 34 can be an element with more than four valence electrons, for example, a group V element such as phosphorous, arsenic, or antimony.

The first photoresist layer is removed and a second photoresist layer (not shown) is applied and patterned, so that center region 26 is exposed and regions 28, 30 are covered. Ions are implanted in center region 26, which is unprotected by the photoresist layer, to form a p-well 36 by doping substrate 10. In the case of a group IV substrate 10, such as germanium, the dopant ions implanted to form p-well 36 can be an element with less than four valence electrons like a group III element such as boron, aluminum or gallium.

In selecting ions for doping both n-wells 32, 34 and p-well 36, the solubility of the dopant ions in substrate 10 may be taken into consideration. In this embodiment, each dopant is capable of forming a stable alloy phase with substrate 10, and is sufficiently soluble in substrate 10 to avoid cluster formation.

After implantation of first and second n-wells 32, 34 and p-well 36, an implant activation anneal is performed by heating substrate 10 in a furnace at a temperature and time which depend on the elements comprising the dopants implanted in n-wells 32, 34 and p-well 36, as well as substrate 10. The anneal may be performed at a temperature which is roughly 70% of the melting point of substrate 10. For example, for a germanium substrate 10 having a melting point of 938° C., a suitable annealing temperature is approximately 658° C. The duration of the annealing depends on the type and dosage of the implanted species, and is a function of the mobility of the implanted dopant. This activation anneal activates dopants to increase the concentration of majority carriers.

Figure 4:
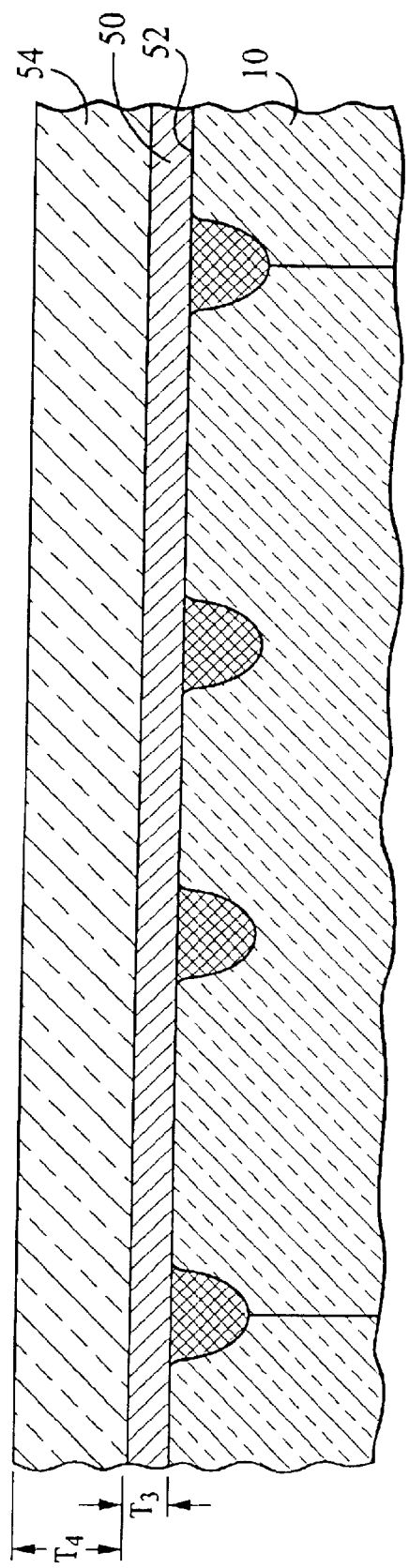

Referring also to FIG. 4, sacrificial oxide layer 12 is removed by a cleaning process that etches the sacrificial oxide without substantially damaging underlying substrate 10. If substrate 10 is made of, e.g., germanium, the cleaning process can include a wet etch with an acid such as a hydrogen fluoride solution. After the cleaning process, a gate dielectric layer 50 with a high dielectric constant, hereinafter referred to as "high-k gate dielectric 50," is grown or deposited over substrate 10. Typically, high-k gate dielectric 50 has a dielectric constant which is at least twice that of the dielectric constant of silicon dioxide, i.e. high-k gate dielectric 50 has a dielectric constant greater than 7.8. High-k gate dielectric 50 is selected such that the high-k gate dielectric 50 is a material compatible with substrate 10. High-k gate dielectric 50 should have a growth temperature less than about 70% of the melting point of substrate 10. High-k gate dielectric 50 should be a non-complex compound whose Gibbs free energy of formation is lower, i.e. more negative, than that of, e.g., a compound formed between a metal comprising high-k gate dielectric 50 and substrate 10. Growth of a high-k gate dielectric 50 compatible with substrate 10 results in an atomically smooth interface 52 between substrate 10 and high-k gate dielectric 50. Potential candidates for high-k gate dielectric 50 material are, e.g., metallic oxides such as $Al_2O_3$, $HfO_2$, $ZrSiO_4$, $SrTiO_3$, $Ta_2O_5$, $BaTiO_3$, $ZrO_2$, $Y_2O_3$, $Ba_xSr_{1-x}TiO_3$, etc., as well as other dielectrics such as $Si_3N_4$, etc. High-k gate dielectric 50 has a thickness $T_3$ of, for example, 103 Å. Because high-k dielectric 50 has a dielectric constant which is more than two times that of $SiO_2$, this thickness $T_3$ is more than two times that of a $SiO_2$ thickness typically used as a gate dielectric in a silicon-based device.

The high dielectric constant of high-k gate dielectric 50 allows one to use a thicker gate dielectric layer than is possible with silicon dioxide, and thereby reduce gate leakage current. High-k gate dielectric 50 acts essentially as a capacitor, with capacitance C=(k*A)/thickness, where k=dielectric constant and A=area of capacitor. The thickness of a high-k gate dielectric having a capacitance equivalent to that of a $SiO_2$ layer of a given thickness is determined by the equation $$\text{Equivalent high-k gate dielectric thickness} = (k_{high-k\ gate\ dielectric}/k_{SiO2}) * SiO_2\ \text{thickness}$$

For example, if the high-k gate dielectric 50 is $Al_2O_3$ having a dielectric constant k of 10 and one needs a capacitance equivalent to that provided by a $SiO_2$ layer having a thickness of 40 Å and a k of 3.9, the required high-k gate dielectric 50 thickness $T_3$ will be:

$$(k_{Al2O3}/k_{SiO2}) * (SiO_2 \text{ thickness}) = (10/3.9) * 40 \text{ Å}$$
$$= 103 \text{ Å}$$

A gate electrode layer 54 is deposited over high-k gate dielectric 50. Gate electrode layer 54 is made of a material selected, in part, on the basis of its work function, i.e. the minimal energy required to move an electron from the Fermi level $E_F$ to vacuum. The work functions of gate electrode layer 54 and substrate 10 are matched, e.g., ideally, that the work function of metal together with the doping level (well doping) of the substrate, and the high k dielectric layer thickness 10 give the desired threshold voltage of the MOS transistors. Gate electrode layer 54 is made of, for example, titanium nitride, e.g., for pMOS germanium; tantalum for, e.g., nMOS germanium; tantalum nitride; titanium; nickel; platinum; polygermanium; polysilicon, etc. Gate electrode 54 has a thickness $T_4$ of, for example, 50 Å–5000 Å.

To specify high-k dielectric layer 50 and gate electrode layer 54 materials, one determines the desired threshold voltage for the transistor that will be formed from these layers. An appropriate high-k dielectric layer 50 thickness is chosen, taking into account the amount of leakage that can be tolerated. The material for the gate electrode layer 54 is selected. The well doping levels of the corresponding n-type well regions 32, 34 for pMOS devices and p-type well regions 36 for NMOS devices are chosen, taking into account gate electrode layer 54 work functions and the high-k dielectric layer 50 thickness $T_3$.

Figure 5:
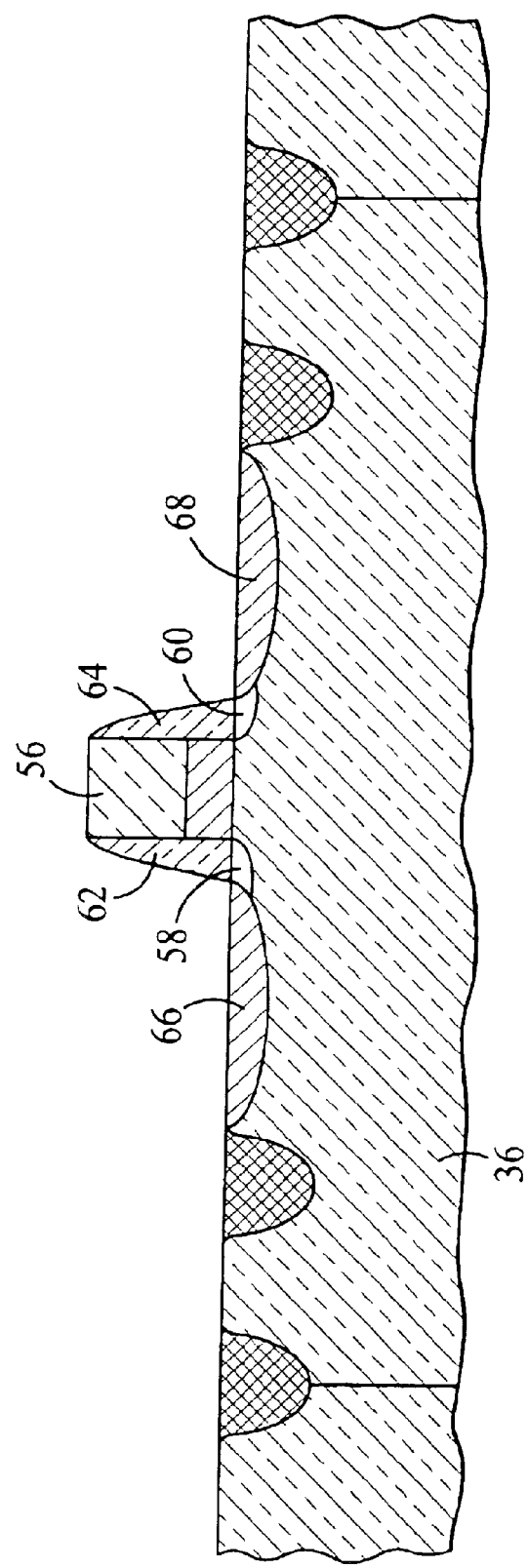

Referring also to FIG. 5, gate electrode layer 54 is patterned by photolithography and etching to define a gate electrode 56. Ions are implanted to form lightly doped drain regions 58, 60. For an NMOS transistor, lightly doped drain regions 58, 60 are formed by the implantation of n-type dopants, such an element having more than four valence electrons, e.g., a Group V element like phosphorous, arsenic, or antimony, into p-well 36. Sidewall spacers 62, 64 are formed proximate gate electrode 56 by the deposition and etchback of a metal oxide(not shown). Source and drain regions 66, 68 are formed by the implantation of n-type dopants into p-well 36. In the case of a germanium substrate 10, suitable n-type dopants would be elements having more than four valence electrons, such as Group V elements. For a pMOS transistor, p-type dopants are used for lightly doped drain regions and for source and drain regions 66,68.

Figure 6:
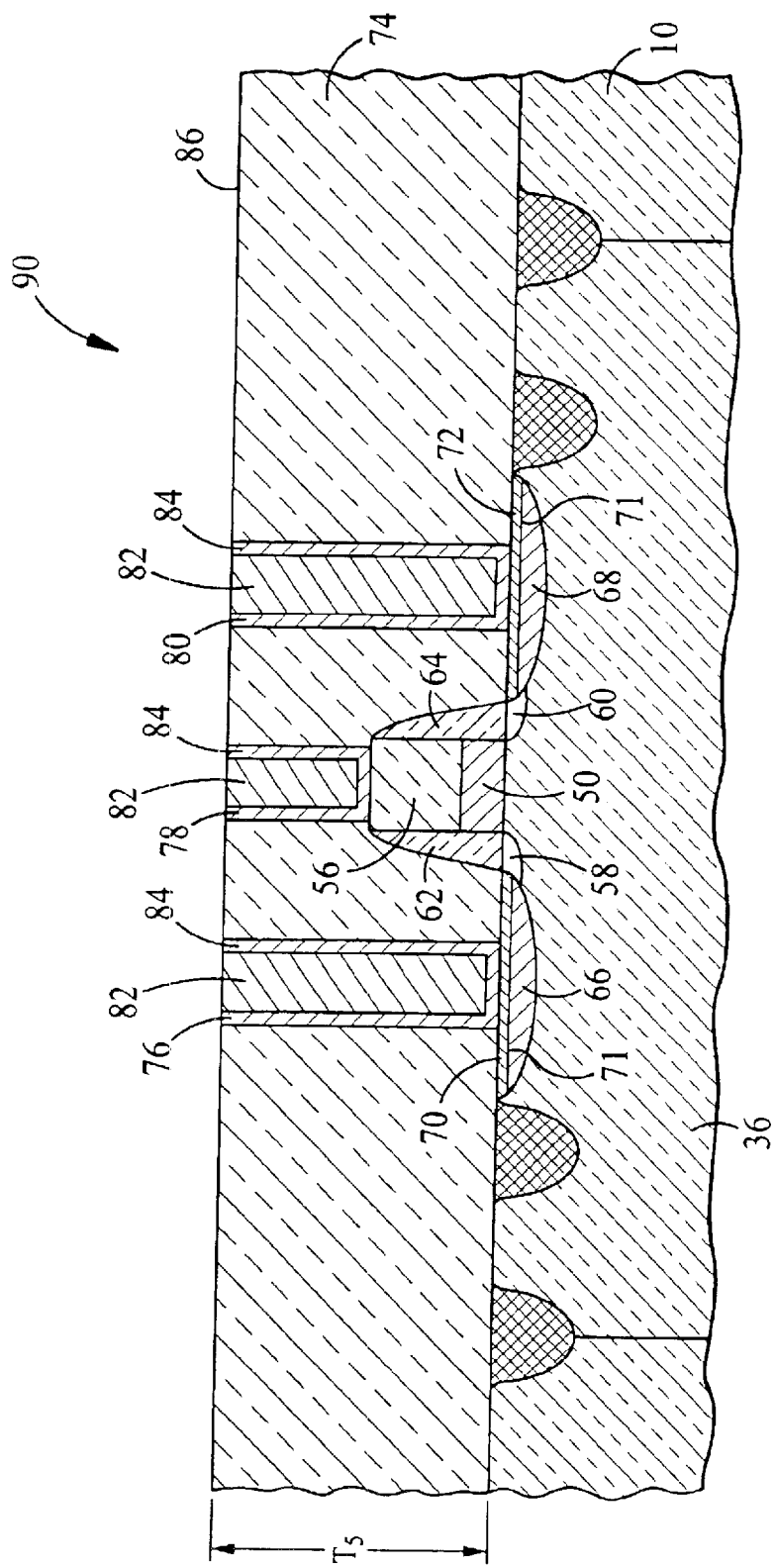

Referring to FIG. 6, source and drain shunting regions 70, 72 are formed by forming a metal such as gold, or titanium nitride by selective growth, by a deposition/patterning technique such as liftoff, or by forming a high conductivity metal/semiconductor compound layer on the substrate 10 by a method analogous to a silicidation technique used for silicon MOSFETs. The metal or metal/semiconductor compound forming source and drain shunting regions 70, 72 have a high conductivity with a low Schottky barrier at a metal/semiconductor interface 71. An interlevel dielectric layer 74 is deposited over substrate 10 and gate electrode 56. Interlevel dielectric layer 74 is, for example, silicon dioxide deposited by PECVD, having a thickness $T_5$ of 500 Å to 1 μm. Photolithography and dry etching are used to define vias 76, 78, 80 through interlevel dielectric layer 74 to source and drain regions 66, 68, and to gate electrode 56, respectively. Vias 76, 78, 80 are filled with a metal 82 and a diffusion barrier 84. Residual metal 82 outside of vias 76, 78, 80 may be polished back by chemical mechanical polishing to expose a top surface 86 of interlevel dielectric 74. Metal 82 is, for example, tungsten deposited by chemical vapor deposition, with a diffusion barrier 84 between metal 82 and source and drain regions 66, 68 and gate electrode 56. Barrier layer 84 is, for example, titanium nitride deposited by physical vapor deposition or chemical vapor deposition.

Transistor 90 includes source and drain regions 66, 68, gate electrode 56, and high-k gate dielectric 50, as well as source and drain shunting regions 70, 72, lightly doped drains 58, 60, and sidewall spacers 62, 64. Transistor 90 is fabricated on substrate 10 formed of, e.g., germanium, a material with a narrow bandgap of 0.66 eV and a carrier mobility higher than that of silicon. Because the cutoff frequency is directly proportional to carrier mobility, substrate 10's high carrier mobility enables transistor 90 to be designed with a cutoff frequency of >200 GHz, which is higher than that obtained with silicon.

After electrical contacts are made to the source region 66, drain region 68, and gate electrode 56, a Damascene interconnect scheme (not shown) is used to connect various transistors 90 to form an integrated circuit.

The application is not limited to the specific embodiments described above. For example, the substrate material can be any semiconducting material having a carrier mobility higher than that of silicon, in addition to the materials listed above. The semiconducting material can be an epitaxial layer on a substrate or it can be a layer bonded to a substrate. The sacrificial oxide layer may be formed by alternative methods, such as grown in a furnace or deposited by low pressure chemical vapor deposition (LPCVD). Instead of isolation trenches, isolation regions can be defined by ion implantation. N-wells and p-wells can be defined before the formation of isolation trenches or isolation regions. High-k gate dielectric can be one of many materials with a high capacitance, in addition to the materials listed above. The gate electrode can be a different material for n-channel and p-channel devices. The source and drain, as well as the lightly doped regions, can be formed by the implantation of various n-type ions. Alternatively, the source, drain, and lightly doped regions can be formed by introducing the ions with a CVD or a solid phase diffusion process. Source and drain shunting regions can be formed by a lift-off process, or a by forming a highly conductive metallic compound with the substrate.

Other embodiments not described herein are also within the scope of the following claims.

What is claimed is:

1. A transistor comprising:
   a semiconductor substrate, the substrate being substantially free of silicon and selected from the group consisting of indium antimonide, lead telluride, indium arsenide, indium phosphide, and gallium antimonide;
   a gate dielectric layer formed over a portion of the substrate, wherein the gate dielectric layer comprises a metal oxide having a dielectric constant greater than 7.8, wherein a portion of the gate dielectric layer has a thickness that is large enough to reduce gate leakage current, and wherein the material comprises a compound having a free energy of formation that is lower than a free energy of formation of a compound that is formed between the material and the semiconductor substrate; and
   a gate electrode defined over a portion of the gate dielectric layer such that the gate dielectric layer has a cross-sectional area substantially similar to a cross-sectional area of the gate electrode.

2. The transistor of claim 1, further comprising:
   a source region and a drain region proximate the gate electrode, the source and drain regions defined by introduced ions.

3. The transistor of claim 2, further comprising:

an interlayer dielectric layer over at least part of the gate electrode, the source region, and the drain region.

4. The transistor of claim 3, wherein the interlevel dielectric defines first, second, and third openings in the interlayer dielectric layer over at least part of the gate electrode, the source region, and the drain region.

5. The transitor of claim 4, further comprising:

a metal within the first, second, and third openings in contact with the gate electrode, source region, and the drain region.

6. The transistor of claim 1, wherein the substrate comprises a material having a carrier mobility greater than a carrier mobility of silicon.

7. The transistor of claim 1, wherein the substrate has a bandgap narrower than a bandgap of silicon.

8. The transistor of claim 7, wherein the gate dielectric comprises at least one of aluminum oxide, hafnium oxide, zirconium silicon oxide, strontium titanium oxide, tantalum oxide, barium titanium oxide, zirconium oxide, yttrium oxide, and barium strontium titanium oxide.

9. The transistor of claim 1, wherein the gate electrode comprises at least one of titanium nitride, tantalum nitride, titanium, tantalum, nickel, platinum, polygermanium, and polysilicon.

10. A device comprising:

a semiconductor substrate, the substrate being substantially free of silicon and selected from the group consisting of indium antimonide, lead telluride, indium arsenide, indium phosphide, and gallium antimonide:

a well formed in a portion of the substrate, the well having a first type of dopant;

a gate dielectric layer formed over a portion of the well, wherein the gate dielectric layer comprises a metal-oxide having a dielectric constant greater than 7.8, wherein a portion of the gate dielectric layer has a thickness that is large enough to reduce gate leakage current, and wherein the material comprises a compound having a free energy of formation that is lower than a free energy of formation of a compound that is formed between the material and the semiconductor substrate;

a gate electrode defined over a portion of the gate dielectric layer such that the gate dielectric layer has a cross-sectional area substantially similar to a cross-sectional area of the gate electrode; and a source region and a drain region defined proximate the gate electrode in the well, the source and drain regions being defined by a second type of dopant.

11. The he device of claim 10, wherein the first dopant is n-type and the second dopant is p-type.

12. The device of claim 10, wherein the first dopant is p-type and the second dopant is n-type.

* * * * *